United States Patent
Okunaga et al.

(10) Patent No.: US 11,014,336 B2
(45) Date of Patent: May 25, 2021

(54) CIRCUIT BOARD AND METHOD FOR MANUFACTURING THE SAME

(71) Applicant: NIPPON PILLAR PACKING CO., LTD., Osaka (JP)

(72) Inventors: Takeshi Okunaga, Osaka (JP); Miyuki Kobayashi, Osaka (JP); Tatsuya Tamaki, Osaka (JP); Kenpei Yamasaki, Osaka (JP); Tomoki Hayashi, Osaka (JP)

(73) Assignee: NIPPON PILLAR PACKING CO., LTD., Osaka (JP)

( * ) Notice: Subject to any disclaimer, the term of this patent is extended or adjusted under 35 U.S.C. 154(b) by 0 days.

(21) Appl. No.: 16/644,648

(22) PCT Filed: Jul. 19, 2018

(86) PCT No.: PCT/JP2018/027095
§ 371 (c)(1),
(2) Date: Apr. 15, 2020

(87) PCT Pub. No.: WO2019/049519
PCT Pub. Date: Mar. 14, 2019

(65) Prior Publication Data
US 2021/0060902 A1    Mar. 4, 2021

(30) Foreign Application Priority Data
Sep. 6, 2017   (JP) .............. JP2017-171348

(51) Int. Cl.
*B23B 3/00* (2006.01)
*B32B 15/095* (2006.01)
(Continued)

(52) U.S. Cl.
CPC ............ *B32B 15/095* (2013.01); *B32B 27/12* (2013.01); *H05K 1/036* (2013.01); *B32B 2457/08* (2013.01)

(58) Field of Classification Search
CPC ...... B32B 15/08; B32B 27/12; B32B 2457/08; H05K 1/0353; H05K 2201/015
See application file for complete search history.

(56) References Cited

U.S. PATENT DOCUMENTS

| | | |
|---|---|---|
| 5,545,475 A | 8/1996 | Korleski |
| 6,417,459 B1 | 7/2002 | Kanzaki et al. |

(Continued)

FOREIGN PATENT DOCUMENTS

| | | | | |
|---|---|---|---|---|
| EP | 1117281 A1 | * | 7/2001 | ........... H05K 1/0366 |
| JP | 2001-148550 A | | 5/2001 | |

(Continued)

OTHER PUBLICATIONS

International Search Report, issued in PCT/JP2018/027095, dated Sep. 11, 2018.

(Continued)

*Primary Examiner* — Elizabeth E Mulvaney
(74) *Attorney, Agent, or Firm* — Birch, Stewart, Kolasch & Birch, LLP

(57) ABSTRACT

A circuit board according to the present invention includes: a first layer containing a fiber base material, and fusible fluororesin with which the fiber base material is impregnated; and second layers containing non-fusible fluororesin that are arranged on the two surfaces of the first layer.

10 Claims, 1 Drawing Sheet

(51) Int. Cl.
*B32B 27/12* (2006.01)
*H05K 1/03* (2006.01)

(56) References Cited

U.S. PATENT DOCUMENTS

| | | | | |
|---|---|---|---|---|
| 2007/0049146 | A1* | 3/2007 | Lee | B32B 27/04 |
| | | | | 442/180 |
| 2008/0311358 | A1* | 12/2008 | Tomii | B32B 27/12 |
| | | | | 428/201 |
| 2010/0000771 | A1* | 1/2010 | Shimauchi | B32B 7/12 |
| | | | | 174/257 |
| 2014/0335341 | A1 | 11/2014 | Park et al. | |
| 2018/0339493 | A1* | 11/2018 | Chen | H05K 1/0353 |

FOREIGN PATENT DOCUMENTS

| | | |
|---|---|---|
| JP | 2007-55054 A | 3/2007 |
| JP | 2015-111625 A | 6/2015 |
| JP | 6344501 B2 * | 6/2018 |

OTHER PUBLICATIONS

Written Opinion of the International Searching Authority, issued in PCT/JP2018/027095, dated Sep. 11, 2018.
Extended European Search Report, dated Apr. 1, 2021, for European Application No. 18853177.6.

* cited by examiner

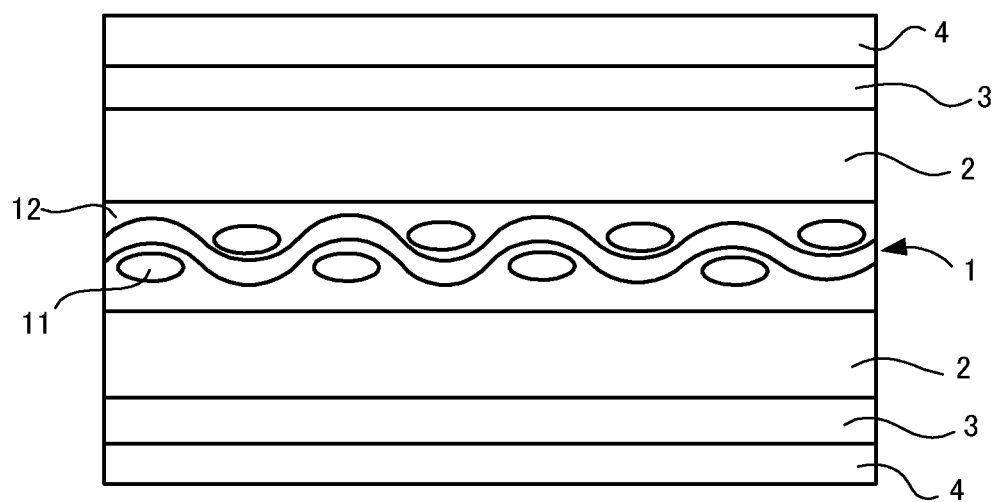

CIRCUIT BOARD AND METHOD FOR MANUFACTURING THE SAME

TECHNICAL FIELD

The present invention relates to a circuit board and a method for manufacturing the same.

BACKGROUND ART

Conventionally, fluororesin is used as a low-dielectric resin in circuit boards. Circuit boards made of fluororesin are particularly used as high-frequency circuit boards. For example, Patent Literature 1 discloses a circuit board obtained by impregnating a fiber base material such as a glass fiber with polytetrafluoroethylene (PTFE).

CITATION LIST

Patent Literature

Patent Literature 1: JP 2001-148550A

SUMMARY OF INVENTION

Technical Problem

The circuit board as mentioned above has a problem in that the fiber base material is insufficiently impregnated with fluororesin, and spaces are thus formed inside the fiber base material. If such spaces are present, the circuit board may absorb water. As a result, problems may arise in that electrical characteristics of the circuit board change, such as dielectric constant, or metal included in a conductive layer on the circuit board deposits along the spaces, which causes a short circuit in the circuit. The present invention was made in order to solve the foregoing problems, and it is an object thereof to provide a circuit board in which the absorption of water can be prevented, and a method for manufacturing the same.

Solution to Problem

A circuit board according to the present invention includes:
a first layer containing a fiber base material, and fusible fluororesin with which the fiber base material is impregnated; and second layers containing non-fusible fluororesin that are arranged on two surfaces of the first layer.

In the above-mentioned circuit board, the fluororesin included in the second layers can contain inorganic fine particles.

The above-mentioned circuit board can further include third layers containing non-fusible fluororesin that cover the second layers.

In the above-mentioned circuit boards, tetrafluoroethylene-perfluoroalkoxyethylene copolymer resin (PFA), tetrafluoroethylene-hexafluoropropylene copolymer (FEP), tetrafluoroethylene-ethylene copolymer (ETFE), vinylidene fluoride resin (PVDF), chlorotrifluoroethylene resin (CTFE), or a combination thereof can be used as the fusible fluororesin.

In the above-mentioned circuit boards, polytetrafluoroethylene (PTFE) can be used as the fusible fluororesin.

In the above-mentioned circuit boards, the fluororesin included in the second layers can contain inorganic fine particles, and it is preferable that a mixing ratio between the fluororesin and the inorganic fine particles included in the second layer is 5:5 to 3:7 when expressed as a volume ratio.

A method for manufacturing a circuit board according to the present invention includes a step of forming a first layer by impregnating a fiber base material with a dispersion liquid of fusible fluororesin and heating the fiber base material at a temperature lower than the melting point of the fusible fluororesin; and a step of forming second layers containing fusible fluororesin on two surfaces of the first layer.

In the above-mentioned method for manufacturing a circuit board, the fluororesin included in the second layers can contain inorganic fine particles.

In the above-mentioned method for manufacturing a circuit board, it is preferable that a mixing ratio between the fluororesin and the inorganic fine particles included in the second layer is 5:5 to 3:7 when expressed as a volume ratio.

In the above-mentioned method for manufacturing a circuit board can further include a step of forming third layers containing non-fusible fluororesin that cover the second layers.

Advantageous Effects of the Invention

With the present invention, the absorption of water can be prevented.

BRIEF DESCRIPTION OF DRAWINGS

FIG. 1 is a cross-sectional view of a circuit board according to an embodiment of the present invention.

DESCRIPTION OF EMBODIMENTS

Hereinafter, an embodiment of a circuit board of the present invention will be described with reference to the drawings. FIG. 1 is a cross-sectional view showing a schematic configuration of a circuit board according to this embodiment.

1. Overview of Circuit Board

As shown in FIG. 1, this circuit board includes a sheet-like first layer 1, two second layers 2 arranged on the two surfaces of the first layer 1, and two third layers 3 arranged on the surfaces of the second layers 2. Conductive layers 4 for forming circuits are formed on the surfaces of the third layers 3. The configurations of these layers will be described in detail below.

2. First Layer

The first layer 1 is formed by impregnating a fiber base material 11 with fusible fluororesin (also referred to merely as "fusible resin" hereinafter) 12. Examples of the fiber base material 11 include, but are not limited to, glass fibers; carbon fibers; plastic fibers such as aramid fibers (aromatic polyamide), poly-p-phenylenebenzobisoxazole (PBO) fibers, polyvinyl alcohol (PVA) fibers, polyethylene (PE) fibers, and polyimide fibers; and inorganic fibers such as basalt fibers. Examples thereof also include metal fibers such as stainless steel fibers. The above-described fiber base materials 11 can be used alone or in a combination of two or more.

There is no particular limitation on the basis weight of the fiber base material 11. However, for example, if the basis weight of the fiber base material 11 is small, the fiber base material 11 may deform due to shrinkage of non-fusible fluororesin in the second layers 2 when the fiber base material 11 is heated during the formation of the first layer 1 and then allowed to cool to room temperature. On the other hand, if the basis weight of the fiber base material 11 is large, the distribution of the dielectric constant in the circuit board may become non-uniform due to a difference between the dielectric constant of the fiber base material 11 and the dielectric constant of the fusible fluororesin 12. From this viewpoint, the basis weight of the fiber base material 11 is preferably 20 to 60 g/m$^2$, and more preferably 30 to 48 g/m$^2$.

Examples of the fusible fluororesin 12 include tetrafluoroethylene-perfluoroalkoxyethylene copolymer resin (PFA), tetrafluoroethylene-hexafluoropropylene copolymer resin (FEP), tetrafluoroethylene-ethylene copolymer resin (ETFE), vinylidene fluoride resin (PVDF), chlorotrifluoroethylene resin (CTFE), and combinations thereof.

The fusible fluororesin as used herein means fluororesin having a high fluidity with which the fibers in the fiber base material 11 can be easily impregnated. Specifically, in addition to the above-described compositions, resin with a melt flow rate (MFR) of 1 to 30 g/10 min can be used, the melt flow rate being measured at 372° C. with a load of 5 kg in conformity with ASTM D 1238, for example. If the melt flow rate is greater than or equal to 1 g/10 min, the fibers in the fiber base material 11 can be easily impregnated with the resin during molding, and spaces are unlikely to be formed. On the other hand, if the melt flow rate is smaller than 1 g/10 min, the fibers in the fiber base material 11 are not impregnated with the resin during molding, and spaces are likely to be formed. It is preferable that the first layer 1 has a thickness of 10 to 30 μm.

3. Second Layer

Next, the second layers 2 will be described. The second layers 2 are made of non-fusible fluororesin (also referred to merely as "non-fusible resin" hereinafter) containing an inorganic filler. Examples of the non-fusible fluororesin include polytetrafluoroethylene (PTFE), modified PTFE, and a combination thereof. The above-mentioned modified PTFE refers to PTFE having a hydroxyl group, an amino group, or a carboxyl group at a terminus of the PTFE molecular chain. Alternatively, as the above-mentioned modified PTFE, mixed resin containing PTFE in an amount of at least more than 50 wt % as a main component and the above-mentioned fusible fluororesin, a liquid crystal polymer (LCP), or the like as a minor component can be used.

The non-fusible fluororesin as used herein means fluororesin having a low fluidity. Specifically, fluororesin whose melt flow rate cannot be measured in the above-described conditions can be used.

The inorganic filler (inorganic fine particles) are added in order to suppress swelling of second layers 2 made of the non-fusible fluororesin, but there is no particular limitation on the specific composition of the inorganic filler. Examples of the inorganic filler include silica, alumina, silicon nitride, aluminum nitride, boron nitride, titanium oxide, silicon carbide, aluminum hydroxide, magnesium hydroxide, titanium white, talc, clay, mica, and glass fibers. A mixture of two or more of the above-mentioned substances may also be used as the inorganic filler.

The average particle diameter ($D_{50}$) of the whole inorganic filler is preferably 0.5 to 20 μm. The mixing ratio between the above-mentioned non-fusible fluororesin and inorganic filler is, for example, preferably 6:4 to 3:7, more preferably 5:5 to 3:7, and even more preferably 4.5:5.5 to 3.5:6.5 when expressed as a volume ratio. That is, the ratio of the inorganic filler can be made smaller or larger than the ratio of the non-fusible fluororesin depending on manufacturing methods as described below. It is preferable that the second layers 2 have a thickness of 60 to 100 μm.

4. Third Layer

Subsequently, the third layers 3 will be described. As the second layers 2, the third layers 3 are made of non-fusible fluororesin, but contain no inorganic filler. The non-fusible resin for the third layers 3 may be different from the non-fusible resin for the second layers 2, but it is preferable that the third layers 3 are made of the same non-fusible resin as the non-fusible resin for the second layers 2. The third layers 3 cover the second layers 2. That is, if the inorganic filler is exposed, the conductive layers 4 may have difficulty adhering and easily separate. Some of the inorganic fillers such as silica have high hydrophilicity, and therefore, if such an inorganic filler is exposed, it may absorb water. Accordingly, the third layers 3 are provided in order to prevent such problems. It is preferable that the third layers 3 have a thickness of 20 to 50 μm.

5. Conductive Layer

The conductive layers 4 are made of metal foil, and copper foil or the like can also be used, for example. If the conductive layers 4 are made of copper foil, unroughened copper foil with a surface roughness (center-line average roughness defined in JIS-B-0601) Ra of 0.2 μm or less, or slightly roughened copper foil (type V in JIS-C-6515) with a maximum value of surface roughness (ten-point average roughness defined in JIS-B-0601) Rz of 5 μm or less can be used, for example. Copper foil (rolled copper foil) whose two surfaces are smooth surfaces that are not roughened or blackened is used, for example. These conductive layers 4 are subjected to an etching process or the like to form a predetermined conductive pattern.

6. Method for Manufacturing Circuit Board

Next, an example of a method for manufacturing a circuit board configured as mentioned above will be described. First, in order to form the first layer 1, the fiber base material 11 is impregnated with a dispersion liquid (dispersion) of fusible resin. The resultant product is passed between a pair of rolls to impregnate the fiber base material 11 with the fusible resin and to adjust the thickness. Next, the resultant product is dried at about 100° C., which is lower than the melting point of the fusible resin, and then heated at a temperature that is lower than the melting point of the fusible resin and at which the dispersion agent (surfactant) of the dispersion liquid is thermally decomposed. For example, when a PFA dispersion is used as the dispersion liquid of the fusible resin, the thermal decomposition temperature can be set to a temperature lower than 300° C., which is lower than 300 to 310° C. at which PFA melts. With this setting, the surfaces of the first layer 1 do not become excessively hard, and thus the second layers 2, which will be described next, can be easily formed thereon. The first layer 1, which is a prepreg, is thus formed. It should be noted that the above-mentioned impregnating step, drying step, and heating step can be repeated until the first layer 1 has a desired thickness.

Subsequently, the second layers 2 are formed. That is, the first layer 1 is immersed in a dispersion liquid (dispersion) of non-fusible resin and an inorganic filler, and thus the material of the second layers 2 is allowed to attach to the two surfaces of the first layer 1. It should be noted that the volume ratio of the non-fusible resin is preferably larger than that of the inorganic filler in the mixture. The resultant product is passed between a pair of rolls to adjust the thicknesses of the second layers 2. Next, the resultant product is dried at 100° C., which is lower than the melting point of the non-fusible resin, and then heated at a temperature higher than 310° C., which is higher than the melting point of the non-fusible resin. The above-mentioned impregnating step, drying step, and heating step can be repeated until the second layers 2 have desired thicknesses. A first intermediate in which the second layers 2 are formed on the two surfaces of the first layer 1 is thus formed.

Subsequently, the third layers 3 are formed on the two surfaces of the first intermediate. That is, the first intermediate is immersed in a dispersion liquid (dispersion) of PFA, which is non-fusible resin, and thus the material of the third layers 3 is allowed to attach to the two surfaces of the first intermediate, that is, the surfaces of the second layers 2. The resultant product is passed between a pair of rolls to adjust the thicknesses of the third layers 3. Next, the resultant product is dried at about 100° C., which is lower than the melting point of the non-fusible resin, and then heated at a temperature higher than 310° C. that is higher than the melting point of the non-fusible resin. The above-mentioned impregnating step, drying step, and heating step can be repeated until the third layers 3 have desired thicknesses. A second intermediate is thus formed.

Lastly, the conductive layers 4 is formed on the two surfaces of the second intermediate. For example, the conductive layers 4 made of copper foil or the like are stacked on the two surfaces of the second intermediate, and then thermocompression bonding is performed at 380° C. (press molding). As a result, the conductive layers 4 are bonded to the two surfaces of the second intermediate layer. A circuit board is thus formed.

7. Features

With the above-described circuit board, fusible fluororesin is used as the resin included in the first layer 1. Since this fusible fluororesin has high fluidity, the fiber base material 11 can be sufficiently impregnated with the fusible fluororesin. Therefore, it is possible to prevent spaces from being formed in the first layer 1 and to prevent the circuit board from absorbing water. As a result, it is possible to prevent the electrical characteristics of the circuit board from being changed due to water.

8. Modified Examples

Although the embodiment of the present invention has been described above, the present invention is not limited to the above-mentioned embodiment, and various modifications can be carried out without departing from the gist of the invention. For example, the following modifications can be carried out. Moreover, modified examples below can be implemented in combination as appropriate.

8-1

Although the circuit board of the above-mentioned embodiment is provided with the conductive layers 4, the above-mentioned second intermediate can be used as a circuit board according to the present invention. That is, the conductive layers 4 can be formed on the second intermediate later.

8-2

In the above-mentioned embodiment, when the first layer 1 is formed, the temperature of the PFA dispersion is set to a temperature lower than 300° C., which is lower than 300 to 310° C. at which PFA melts. The reason for this is that, as mentioned above, the second layers 2 have a configuration in that the volume ratio of the inorganic filler is smaller than that of the non-fusible resin. When the ratio of the inorganic filler is small in this manner, the anchor effect, which refers to engagement with the second layers 2, decreases. Therefore, formation of the second layers 2 is made easier by setting the temperature of the PFA in the first layer 1 to be low such that the surfaces do not become excessively hard.

In contrast, the ratio of the inorganic filler in the second layers 2 can also be larger than that of the non-fusible resin. In this case, even when a temperature at which the fusible resin (e.g., PFA) in the first layer 1 is heated is set to a temperature higher than the melting point, and thus the surfaces become hard, the anchor effect, which refers to engagement of the inorganic filler in the second layer 2 with the first layer 1, can be expected. Therefore, even when a temperature at which the fusible resin in the first layer 1 is heated is increased, the second layers 2 can be firmly formed on the first layer 1. When a temperature at which the fusible resin 12 is heated is increased, the fiber base material 11 of the first layer 1 is sufficiently impregnated with the fusible resin 12, thus making it possible to further prevent spaces from being formed in the fiber base material 11.

8-3

The second layers 2 need not necessarily contain the inorganic filler, and the second layer 2 can also be made of only non-fusible fluororesin. In this case, the third layers 3 need not be formed, and the conductive layers 4 can be formed as needed on the outer surfaces of the second layers 2.

8-4

The second layers 2 each can be constituted by a non-fusible fluororesin layer containing no inorganic filler and non-fusible fluororesin layers containing an inorganic filler arranged on the two sides of the non-fusible fluororesin layer containing no inorganic filler. In this case, the third layers 3 can be formed on the two sides of the above-mentioned intermediate.

EXAMPLES

Hereinafter, examples of the present invention will be described. However, the present invention is not limited to the examples below.

Circuit boards according to Examples 1 and 2 and Comparative Example were formed as described below.

(1) Example 1

Glass fibers of 30 g/m$^2$ were prepared as a fiber base material. Next, the fiber base material was impregnated with a dispersion liquid of PFA. Subsequently, the resultant product was passed between a pair of rollers to adjust the thickness, and was then dried at about 100° C. The resultant product was heated at a temperature lower than 300° C., which is lower than the melting point of PFA, and a first layer was thus formed.

Next, the first layer was immersed in a dispersion liquid in which PTFE and silica serving as an inorganic filler were mixed to allow this mixed solution to attach to the two surfaces of the first layer. The average particle diameter of the silica was 5 μm. The volume ratio of the PTFE to the silica was set to 6:4. The resultant product was passed between a pair of rollers to adjust the thickness, and was then dried at about 100° C. Subsequently, the resultant product was heated at about 360° C., which is higher than the melting point of PTFE, and a first intermediate in which second layers were formed on the first layer was thus formed.

Subsequently, the first intermediate was immersed in a dispersion liquid of PTFE to allow PTFE to attach to the two sides of the first layer. The resultant product was passed between a pair of rollers to adjust the thickness, and was then dried at about 100° C. Subsequently, the resultant product was heated at about 360° C., which is higher than the melting point of PTFE, and a second intermediate in which third layers were formed on the second layers was thus formed. Here, this second intermediate was taken as Example 1.

(2) Example 2

Glass fibers of 30 g/m² were prepared as a fiber base material. Next, the fiber base material was impregnated with a dispersion liquid of PFA. Subsequently, the resultant product was passed between a pair of rollers to adjust the thickness, and was then dried at about 100° C. The resultant product was heated at a temperature higher than 340° C., which is higher than the melting point of PFA, and a first layer was thus formed.

Next, the first layer was immersed in a dispersion liquid in which PTFE and silica serving as an inorganic filler were mixed to allow this mixed solution to attach to the two surfaces of the first layer. The average particle diameter of the silica was 5 μm. The volume ratio of the PTFE to the silica was set to 4:6. The resultant product was passed between a pair of rollers to adjust the thickness, and was then dried at about 100° C. Subsequently, the resultant product was heated at about 340° C., which is higher than the melting point of PTFE, and a first intermediate in which second layers were formed on the first layer was thus formed.

Subsequently the third layers were formed in the same manner as in Example 1, and a second intermediate was thus formed. Here, this second intermediate was taken as Example 2.

(3) Comparative Example

Glass fibers of 30 g/m² were prepared as a fiber base material. Next, the fiber base material was impregnated with a dispersion liquid of PTFE. Next, the resultant product was passed between a pair of rollers to adjust the thickness, and was then dried at about 100° C. Subsequently, the resultant product was heated at a temperature higher than 360° C., which is higher than the melting point of PTFE, and a first layer was thus formed.

Next, second layers and third layers were formed on the first layer in the same manner as in Example 1, and a second intermediate was thus formed. Here, this second intermediate was taken as Comparative Example.

(4) Evaluation

Five products were produced for each of the above-described Examples 1 and 2 and Comparative Example, and a water absorption test in conformity with "JIS C 6481 5.14: Test methods of copper-clad laminates for printed wiring boards; Water absorption ratio" was performed on these products. The calculated averages of the water absorption ratios were as follows.
Example 1: 0.09%
Example 2: 0.07%
Comparative Example: 0.18%

As is clear from the results above, the water absorption ratios of Examples 1 and 2 were about 50% of that of Comparative Example. Therefore, it is thought that, when PFA, which is a fusible resin, was used in the first layer, the fiber base material was sufficiently impregnated with PFA, and thus the formation of spaces was prevented. It is thought that this caused a decrease in the water absorption ratio. In particular, it is thought that, since the heating temperature during the formation of the first layer was set to 340° C., which is higher than the melting point of PFA, in Example 2, the fiber base material was further impregnated with PFA, and thus the formation of spaces was further prevented. As a result, the water absorption ratio of Example 2 was smaller than that of Example 1.

LIST OF REFERENCE NUMERALS

1 First layer
11 Fiber base material
12 Fusible fluororesin
2 Second layer
3 Third layer

The invention claimed is:

1. A circuit board comprising:
a first layer containing a fiber base material, and fusible fluororesin with which the fiber base material is impregnated; and
second layers containing non-fusible fluororesin that are arranged on two surfaces of the first layer.

2. The circuit board according to claim 1, wherein the fluororesin included in the second layers contains inorganic fine particles.

3. The circuit board according to claim 2, further comprising third layers containing non-fusible fluororesin that cover the second layers.

4. The circuit board according to claim 1, wherein tetrafluoroethylene-perfluoroalkoxyethylene copolymer resin (PFA), tetrafluoroethylene-hexafluoropropylene copolymer (FEP), tetrafluoroethylene-ethylene copolymer (ETFE), vinylidene fluoride resin (PVDF), chlorotrifluoroethylene resin (CTFE), or a combination thereof is used as the fusible fluororesin.

5. The circuit board according to claim 1, wherein polytetrafluoroethylene (PTFE) is used as the non-fusible fluororesin.

6. The circuit board according to claim 1,
wherein the fluororesin included in the second layers contains inorganic fine particles, and
a mixing ratio between the fluororesin and the inorganic fine particles included in the second layer is 5:5 to 3:7 when expressed as a volume ratio.

7. A method for manufacturing a circuit board, comprising:
forming a first layer by impregnating a fiber base material with a dispersion liquid of fusible fluororesin and heating the fiber base material at a temperature lower than the melting point of the fusible fluororesin; and
forming second layers containing non-fusible fluororesin on two surfaces of the first layer.

8. The method for manufacturing a circuit board according to claim 7, wherein the fluororesin included in the second layers contains inorganic fine particles.

9. The method for manufacturing a circuit board according to claim 8, wherein a mixing ratio between the fluororesin and the inorganic fine particles included in the second layer is 5:5 to 3:7 when expressed as a volume ratio.

10. The method for manufacturing a circuit board according to claim 8, the method further comprising forming third layers containing non-fusible fluororesin that cover the second layers.

* * * * *